(12) United States Patent
Katoch

(10) Patent No.: US 8,509,018 B2
(45) Date of Patent: Aug. 13, 2013

(54) SENSE AMPLIFIER WITH ADJUSTABLE BACK BIAS

(75) Inventor: Atul Katoch, Kanata (CA)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 300 days.

(21) Appl. No.: 12/855,289

(22) Filed: Aug. 12, 2010

(65) Prior Publication Data

US 2012/0039143 A1 Feb. 16, 2012

(51) Int. Cl.
*G11C 7/02* (2006.01)

(52) U.S. Cl.
USPC ............... 365/207; 365/189.09; 365/203

(58) Field of Classification Search
USPC .................. 365/207, 189.09, 203
See application file for complete search history.

(56) References Cited

U.S. PATENT DOCUMENTS

| | | | |
|---|---|---|---|
| 7,362,636 B2 * | 4/2008 | Tsukada | 365/205 |
| 7,548,476 B2 * | 6/2009 | Savignac et al. | 365/207 |
| 2001/0043089 A1 | 11/2001 | Forbes et al. | |
| 2006/0273842 A1 | 12/2006 | Kim et al. | |
| 2007/0053234 A1 * | 3/2007 | Tsukada | 365/205 |
| 2007/0153601 A1 | 7/2007 | Savignae et al. | |

OTHER PUBLICATIONS

Shimomura, Kenichi, et al., "A 1-V 46-ns 16-Mb SOI-DRAM with Body Control Technique", IEEE Journal of Solid-State Circuits, IEEE Service Center, Piscataway, NJ, USA, vol. 32, No. 11, Nov. 1, 1997, pp. 1712-1720.
European Search Report from corresponding EP Application No. 10187911.2.
Office Action dated May 6, 2013 from corresponding application No. CN 201010569631.7.

\* cited by examiner

*Primary Examiner* — Toan Le
(74) *Attorney, Agent, or Firm* — Lowe Hauptman Ham & Berner, LLP

(57) ABSTRACT

A circuit having a sensing circuit and at least one of a first node and a second node is described. The sensing circuit includes a pair of a first type transistors and a pair of a second type transistors. Each transistor of the pair of the first type transistors is coupled in series with a transistor of the pair of the second type transistors. The first node has a first voltage and is coupled to each bulk of each transistor of the pair of the first type transistors. The second node has a second voltage and is coupled to each bulk of each transistor of the pair of the second type transistors.

20 Claims, 5 Drawing Sheets

SENSE AMPLIFIER WITH ADJUSTABLE BACK BIAS

FIELD

The present disclosure is generally related to sense amplifiers, and particularly, to a sense amplifier with an adjustable back bias.

BACKGROUND

In a conventional sense amplifier used in dynamic random access memory (DRAM) and having bit lines pre-charged to half of the operation voltage VDD, the gate overdrive voltage during sensing is quite small, especially in the 28 nm and below semiconductor process technologies, which slows down the sensing speed. The gate overdrive voltage is commonly known as the voltage difference between the gate-to-source voltage (e.g., voltage VGS) and the threshold voltage (e.g., voltage Vt) of a transistor. In some approaches, without using ultra-low threshold voltage (ULVt) devices, sensing may not meet the specified speed requirement and/or may require extra masks, which increases manufacturing cost.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
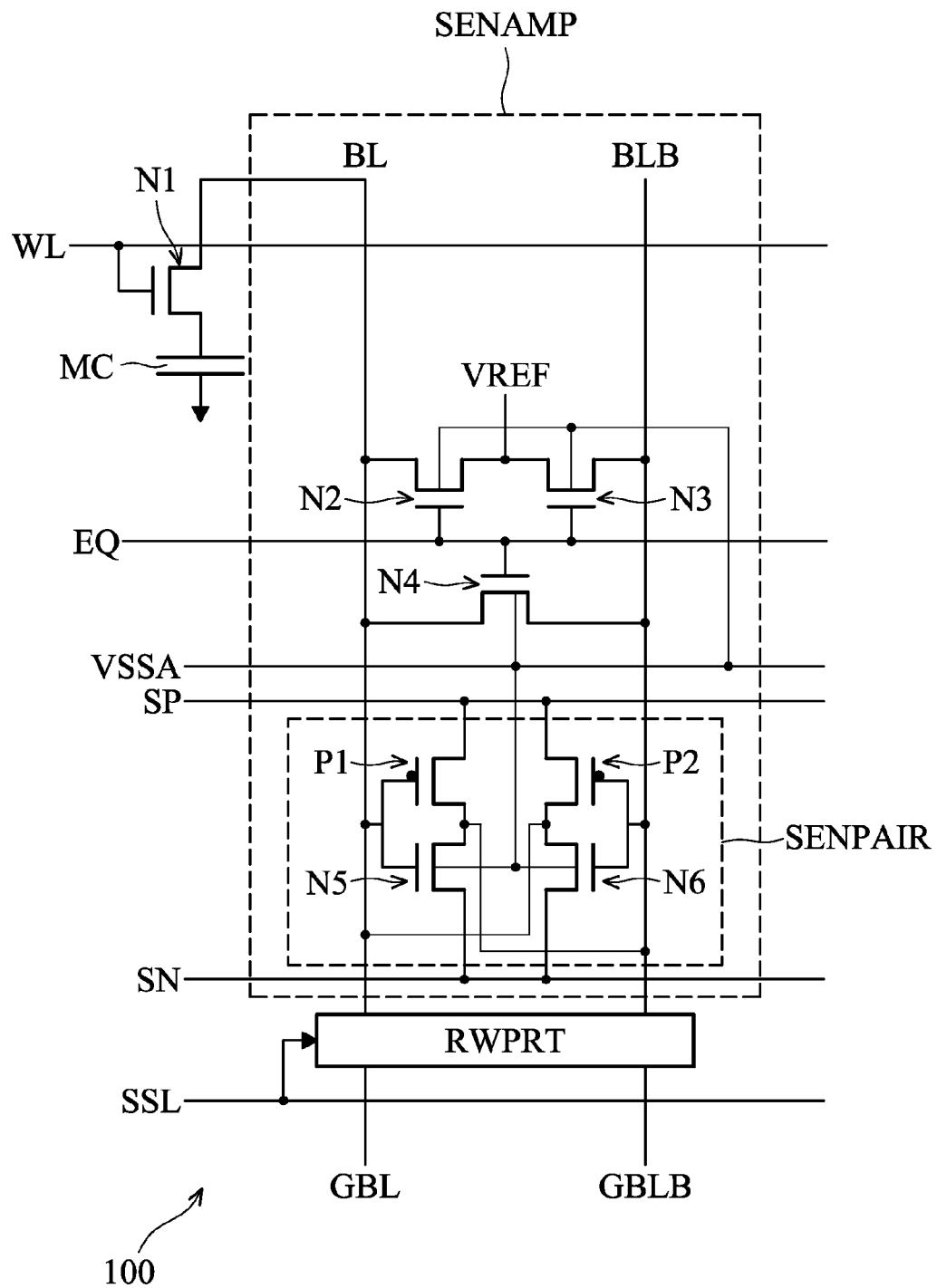
FIG. 1 is a diagram of an exemplary circuit in which a sense amplifier is used with a memory cell, in accordance with some embodiments.

Embodiments, or examples, illustrated in the drawings are disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments can have one or a combination of the following advantages and/or features. In some embodiments, the ULVt devices are not required. In some technologies, including 28 nanometer (nm) technologies, omitting UL Vt devices avoids two additional masks in the manufacturing process. In some embodiments, after sensing, the read data from a memory cell is quickly restored and written back to the memory cell. Compared to other approaches, the read data in those approaches can be degraded to a point that the read data becomes completely unrecoverable.

Exemplary Circuit

FIG. 1 is a schematic diagram of a circuit 100 illustrating a sense amplifier SENAMP being used with a memory cell MC, in accordance with some embodiments. Transistor N1 enables access between sense amplifier SENAMP and memory cell MC. In some embodiments, memory cell MC is a cell of a DRAM, but the disclosed embodiments are not so limited.

Transistors P1, P2, N5 and N6 form the sensing pair SENPAIR for sense amplifier SENAMP. Transistors N2, N3, and N4 together with the corresponding signals EQ and VREF pre-charge and equalize bit lines BL and BLB. For example, when signal EQ is activated (e.g., applied with a high logic level (e.g., a High)) transistors N2 and N3 turn on, and voltage VREF is transferred to bit lines BL and BLB. Stated another way, transistors N2 and N3 charge (or pre-charge) bit lines BL and BLB to voltage VREF. The term "pre-charge" is commonly used, because bit lines BL and BLB are usually charged to a certain voltage level before reading and/or writing. Additionally, because signal EQ is activated, transistor N4 also turns on, enabling the voltage at its drain and source (e.g., the respective bit line BL and BLB) to be equal (e.g., equalized).

Voltage VREF serves as a reference point to which signals BL, BLB, SP, and SN are pre-charged and equalized when appropriate (e.g., before sensing and reading). When signal EQ is activated (e.g., applied with a High), it turns on transistors N2 and N3, allowing VREF to be forced onto the respective bit lines BL and BLB. In some embodiments, voltage VREF is set at half of voltage VDD for a pre-charge.

Signal EQ equalizes signals BL and BLB. When signal EQ is activated, e.g., applied with a High, it turns on transistor N4, allowing signals BL and BLB to be at the same level (e.g., VREF).

Word line WL controls transistor N1 to allow access to memory cell MC. When word line WL is de-activated, e.g., applied with a Low, it turns off transistor N1 and thus electrically disconnects memory cell MC from the bit line being connected to memory cell MC. In contrast, when word line WL is activated, e.g., applied with a High, it turns on transistor N1 and thus connects memory cell MC to a bit line, e.g., a bit line BL or a bit line BLB. FIG. 1 shows bit line BL electrically connected to memory cell MC (via transistor N1) for illustration purposes only. Depending on implementations in a memory array, some memory cells are connected to a bit line BL while some other memory cells are connected to a bit line BLB.

In some embodiments, memory cell MC is a capacitor storing charges, and the Low data stored in memory cell MC indicates a voltage lower than voltage VREF, while the High data indicates a voltage higher than voltage VREF. When memory cell MC is connected to a bit line, e.g., bit line BL as shown in FIG. 1, memory cell MC shares the same charge with bit line BL. Depending on the charge representing the logic level of the data stored in memory cell MC, bit line BL is pulled one way or another. For example, if memory cell MC stores a Low, then bit line BL is pulled towards ground. Conversely, if memory cell MC stores a High, then bit line BL is pulled towards voltage VDD. Once bit line BL shares the charge with memory cell MC, bit line BL and bit line BLB develop a voltage difference between them, which is called a bit line split. The amplitude of the bit line split depends on the charge transfer ratio or the capacitance of memory cell MC and that of bit line BL. If bit line BL is longer and connected to a lot of memory cells, the charge ratio becomes smaller and the bit line split is reduced. Conversely, if bit line BL is shorter and connected to fewer memory cells, the charge ratio becomes higher and the bit line split is increased.

Bit lines BL and BLB serve as both input and output (I/O) for sense amplifier SENAMP. Generally, except when being pulled to VREF to be pre-charged and equalized, bit lines BL and BLB are of the opposite level of one another. For example, if bit line BL is Low then bit line BLB is High, and if bit line BL is High then bit line BLB is Low. Further, the bit line on which the data is written or sensed is referenced to the other bit line. For example, applying a High to bit line BL and a Low to bit line BLB, enables memory cell MC to be written with a High. Conversely, applying a Low to bit line BL and a High to bit line BLB, enables memory cell MC to be written with a Low. Further, in a read cycle, sensing (or reading) the logic level at a bit line, e.g., bit line BL, in reference to the other bit line, e.g., bit line BLB, reveals the data stored in memory cell MC. For example, if memory cell stores a High, then sensing a bit line, e.g., bit line BL, reveals a High. Conversely, if memory cell MC stores a Low then sensing a bit line, e.g., bit line, BL, reveals a Low.

Signals SP and SN provide the operation power for sense amplifier SENAMP, e.g., to turn it on or off. In some embodiments, signals SP and SN, when appropriate, are pre-charged and equalized, but for simplicity, the pre-charge and equalization circuit for signals SP and SN (e.g., circuit PESPN) is not shown. In some embodiments, circuit PESPN is similar to the pre-charge and equalization circuit for bit lines BL and BLB. For example, circuit PESPN includes three transistors, e.g., transistors N7, N8, and N9 (not shown) corresponding to the respective transistors N2, N3, and N4, controlled by the same signals EQ and VREF. Signal SP is the operation power while signal SN serves as ground. In general, when signals SP and SN are at a same level, e.g., pulled to VREF, amplifier SENAMP is off. But when signal SP is High (e.g., at VDD) and signal SN is Low (e.g., at ground), sense amplifier SENAMP is on. For example, in some embodiments, and at a pre-charge and equalization stage, sense amplifier SENAMP is off when signals SP and SN are pulled to VREF. When signal SP is raised from VREF to VDD and signal SN is pulled from VREF to VSS, sense amplifier SENAMP receives the desired electrical power and, consequently, is turned on.

Voltage VSSA is coupled to the bulk of NMOS transistors N5 and N6. In some embodiments, because the bulk of NMOS transistors in sense amplifier SENAMP are coupled together, voltage VSSA, in effect, is coupled to the bulk of transistors N2, N3, N4, N5, and N6 together. In some embodiments, voltage VSSA is raised during sensing (e.g., when signals SP and SN are raised and lowered to the respective voltage VDD and VSS to turn on sensing pair SENPAIR) to about one third or one half of voltage VDD. In some embodiments, the raised voltage VSSA increases (e.g., optimizes) the speed of sense amplifier SENAMP, because when voltage VSSA is raised, the voltage levels of bit lines BL and BLB are quickly pulled up and pulled down to the desired levels. In some embodiments, the raised voltage VSSA is limited to 0.7 V, which is the amplitude of the forward bias turning on a diode in the bulk of the respective transistor. In some embodiments, the nominal VDD is 0.95 V. In some embodiments, voltage VSSA is generated using a voltage regulator or is supplied by an external voltage supply.

When voltage VSSA is raised, the threshold voltage of transistors N2, N3, N4, N5, and N6 are temporarily lowered during sensing, which causes an increase in the current generated by those transistors. As a result, in some embodiments, sense amplifier SENAMP operates at a higher frequency, which is advantageous over other approaches in which the bulk of these NMOS transistors N2, N3, N4, N5, and N6 are fixed to a level (e.g., ground). Voltage VSSA is also called the back bias because voltage VSSA biases the bulks of the corresponding transistors. Because voltage VSSA is adjustable, voltage VSSA is called a dynamic back bias. In some embodiments, the bulk of PMOS transistors P1 and P2 are coupled to voltage VDD.

Global bit lines GBL and GBLB enable data transferring between local bit lines BL and BLB and other components, e.g., another level of sense amplifiers (not shown). Signal SSL, via the read write port RWPRT, enables such a transfer.

Read-write port RWPRT serves as a mechanism for transferring data between bit lines BL and BLB to other circuitry. For example, in a read access in some embodiments, once the data stored in memory MC is transferred to bit lines BL and BLB, the data is then, through read-write port RWPRT, transferred to a read circuit that provides the actual read data. In contrast, in a write access, the data from the outside circuit, through read-write port RWPRT, is placed on bit lines BL and BLB, and is then transferred to memory cell MC.

Exemplary Method

Figure 2:
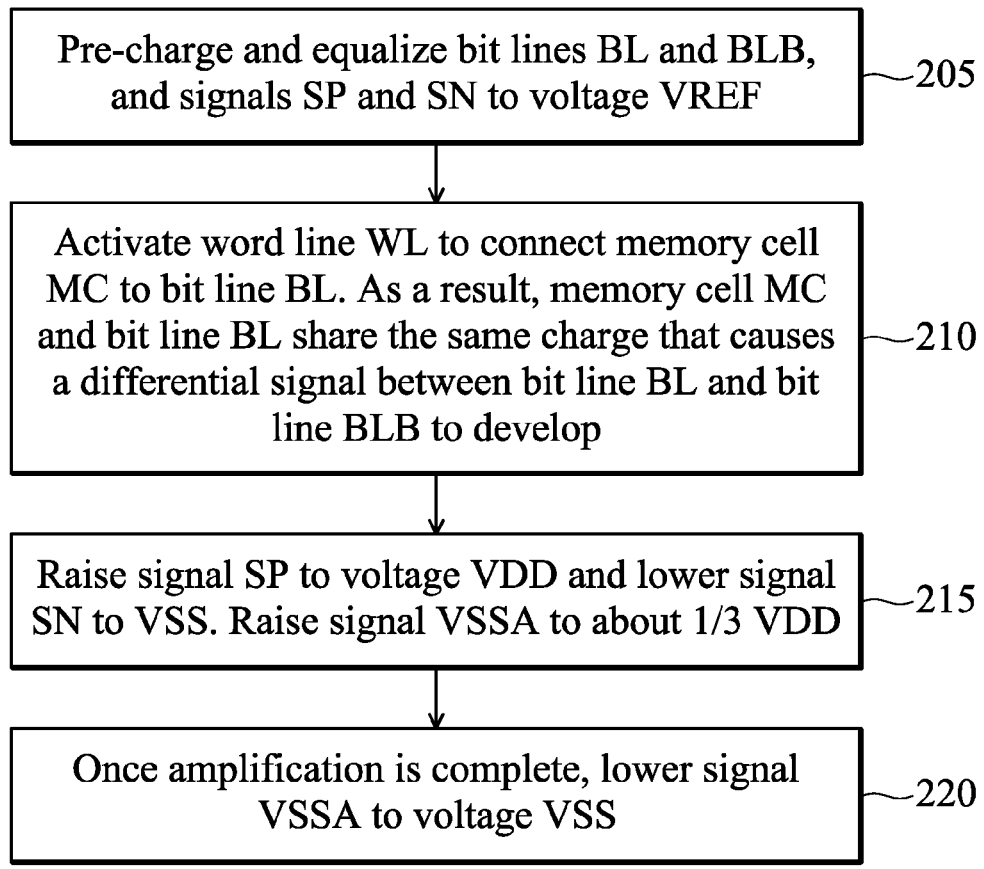
FIG. 2 is a flowchart illustrating an operation of the circuit in FIG. 1, in accordance with some embodiments.

FIG. 2 is a flowchart 200 illustrating a method for operating circuit 100, in accordance with some embodiments. In this illustration, memory cell MC stores a High.

In step 205, bit lines BL and BLB, and signals SP and SN are pre-charged and equalized to VREF, which, in some embodiments, is set at one half VDD.

In step 210, once pre-charge and equalization is complete, signal EQ is deactivated to disconnect bit lines BL and BLB from transistors N2 and N3. Word line WL is activated to connect memory cell MC to a bit line, which, in the illustration of FIG. 1, is bit line BL. As a result, bit line BL and memory cell MC shares the same charge and cause a differential signal (e.g., a bit line split) to develop between bit line BL and bit line BLB.

In step 215, when the bit line split is large enough, signal SP is raised to VDD while signal VSS is pulled to ground to turn on sensing pair SENPAIR. In some embodiments, the bit line split that is considered large enough is based on one or a combination of a predetermined voltage difference between the two bit lines BL and BLB, a predetermined time elapse (e.g., from the time sensing pair SENPAIR is turned on) or a simulation model. At about the same time sensing pair SENPAIR is turned on, signal VSSA is raised to about one third VDD. Consequently, sense amplifier SENAMP is activated, and amplifies the bit line split, e.g., causes bit lines BL and BLB to swing from voltage VREF (e.g., one half VDD) to the respective voltage VDD and voltage VSS.

In step 220, once amplification is complete, signal VSSA is lowered to voltage VSS. Similar to the bit line split, completing amplification is based on one or a combination of a predetermined voltage difference between bit lines BL and BLB, a predetermined time elapse from the time sensing pair SENPAIR is turned on or a simulation model.

After amplification is complete, an actual read or write operation is performed. For example, for a read operation, the data on bit lines BL and BLB are transferred via read-write port RWPRT to the outside circuit. For a write operation, however, the written data, via read-write port RWPRT, are transferred to bit lines BL and BLB to be written to memory cell MC.

Exemplary Waveforms

Figure 3:
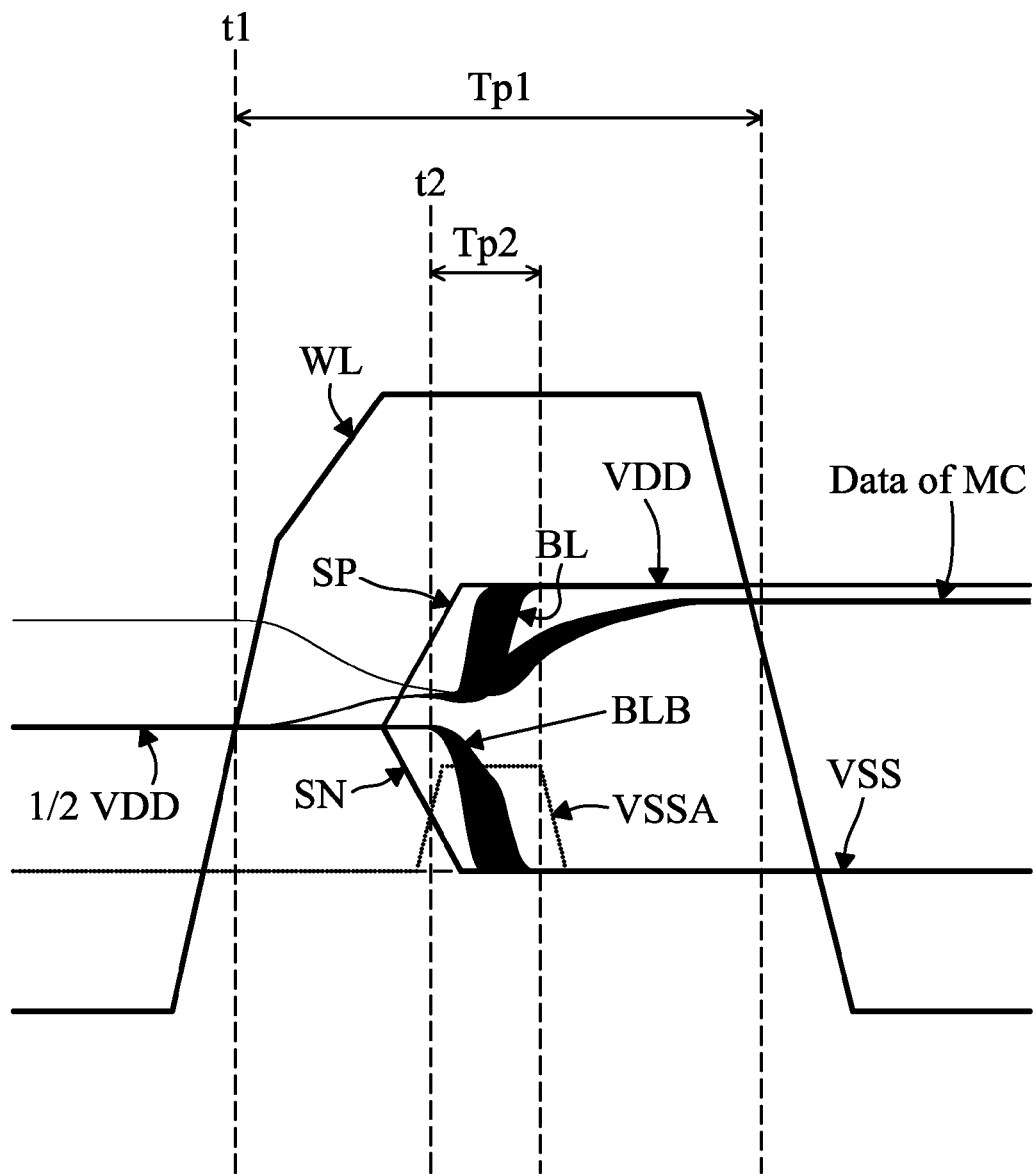
FIG. 3 is a graph of waveforms illustrating an operation of the circuit in FIG. 1, in accordance with some embodiments.

FIG. 3 is a graph of waveforms illustrating an operation of circuit 100, in accordance with some embodiments. In this illustration, memory cell MC stores High data.

Prior to time t1, signals SP, SN, BL, and BLB are precharged and equalized to half of VDD. During time period tp1, word line WL is activated (e.g., High) for the data stored in memory cell MC to be sense/read. In some embodiments, the logic swing of word line WL is significantly higher than the logic swing of other signals, e.g., signals BL, BLB, SP, SN, etc.

At about time t2, signals SP and SN are at the levels sufficient to activate sensing pair SENPAIR. At about the same time, signal VSSA is raised to about one third VDD and remains at that level for the time period tp2. Because sensing pair SENPAIR is on, bit line BL, sharing the High charge of memory cell MC, is pulled toward voltage VDD while bit line BLB is pulled towards voltage VSS. In some embodiments, because voltage VSSA is raised, the threshold voltage Vt of transistors N5 and N6 is reduced. The currents generated in transistors N5 and N6 increase, resulting in bit lines BL and BLB being pulled to the respective voltages VDD and VSS more quickly than if voltage VSSA is not raised. Further, the data of memory cell MC is restored to the High level (e.g., VDD) quickly. Because bit lines BL and BLB are pulled to their respective High and Low quickly, and the data of memory MC is restored to the High level quickly, the time period p1 that word line WL is High is shortened. As a result, circuit 100 operates at a higher frequency. Without raising voltage VSSA, bit lines BL and BLB slowly reach the respective VDD and VSS, and similarly, the data of memory cell MC slowly returns to its value (e.g., High). The time period tp1 is therefore longer, or circuit 100 operates at a lower frequency. Without raising voltage VSSA, the data to be written back to memory cell MC can even be completely destroyed (e.g., turn to a Low in the above illustration).

FIG. 3 shows bit lines BL and BLB when transitioning towards the respective VDD and VSS experience a range (rather than a straight line), indicating that transistors N5 and N6, in some embodiments, even though are designed the same, are subject to the variations of oxide thickness, processing dopant, gate length changes, which is consistent with the Monte-Carlo spread theory.

Exemplary Circuits

Further Embodiments

Figure 4:
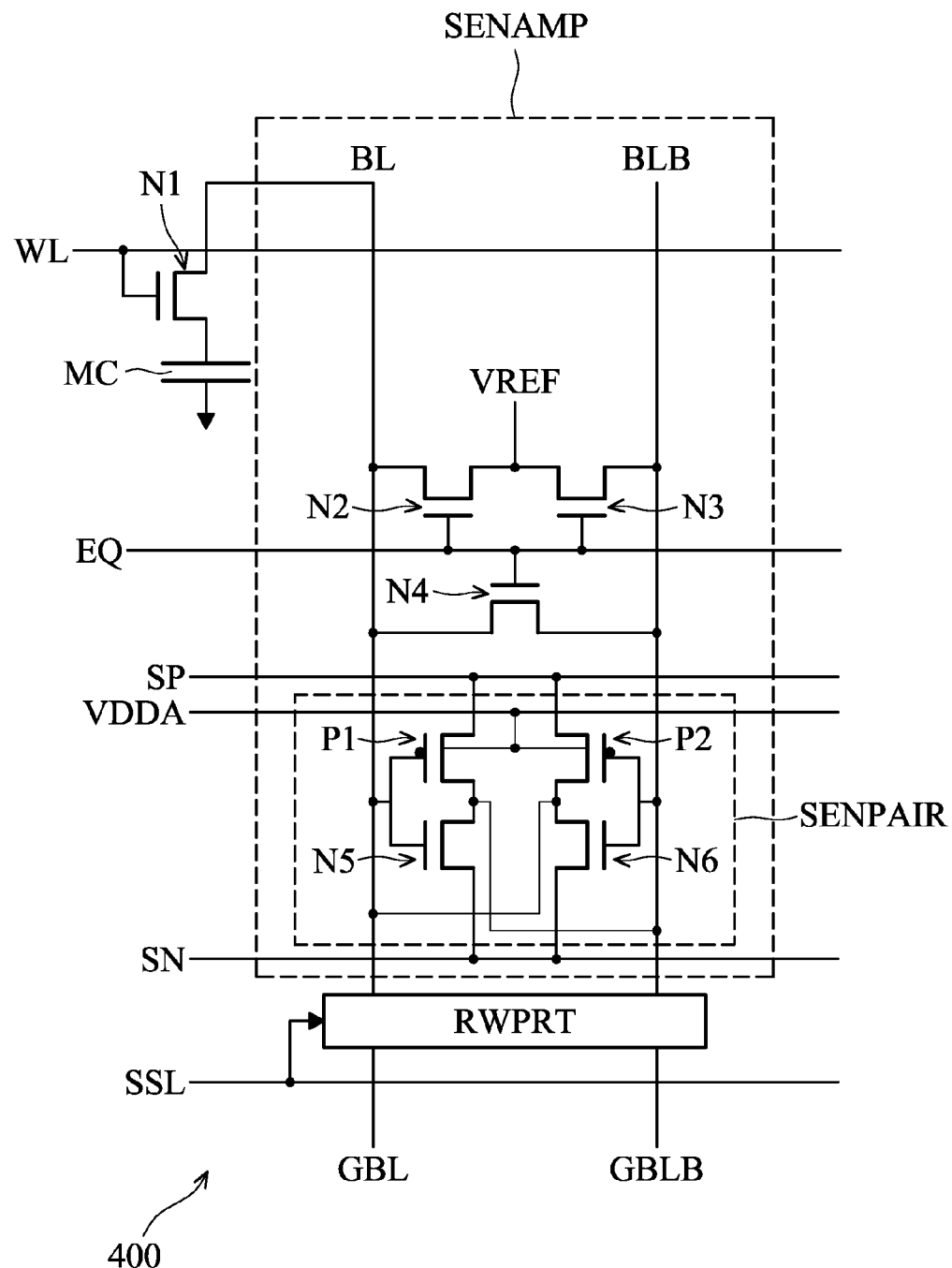
FIG. 4 is a diagram of an exemplary circuit in which a sense amplifier is used with a memory cell, in accordance with some further embodiments.

FIG. 4 is a diagram of a circuit 400, in accordance with some embodiments. Circuit 400, compared with circuit 100, does not receive signal VSSA but receives signal VDDA electrically coupled to the bulks of PMOS transistors P1 and P2. In some embodiments, because there is no signal VSSA, the bulks of NMOS transistors N5 and N6 are electrically coupled to voltage VSS. Further, in some embodiments, because the bulk of all NMOS transistors in sense amplifier SENAMP are coupled together, the bulk of NMOS transistors N2, N3, N4, N5, and N6, in effect, are coupled together and to VSS.

Circuit 400 operates in the same manner as circuit 100, except when voltage VSSA is raised in circuit 100, voltage VDDA is lowered in circuit 400. In some embodiments, voltage VDDA is lowered by the same amount that voltage VSSA is raised (e.g., about one third VDD to about one half VDD during sensing). When voltage VDDA is lowered, the threshold voltage Vtp of transistors P1 and P2 are lowered causing the currents generated by transistors P1 and P2 to increase and thus pulling bit lines BL and BLB to the respective level quickly as appropriate, in the same manner as circuit 100 functions when voltage VSSA is raised.

Figure 5:
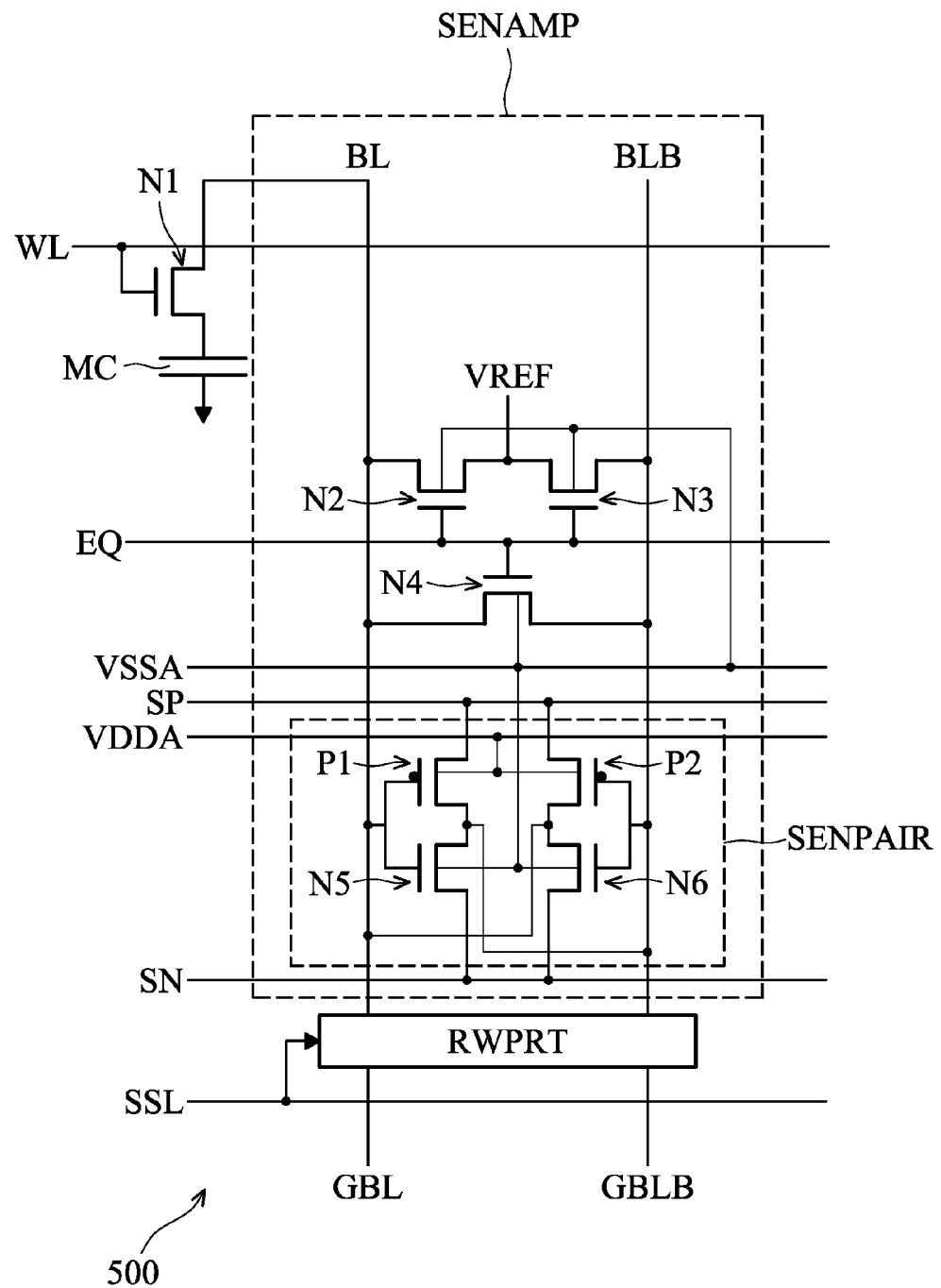
FIG. 5 is a diagram of an exemplary circuit in which a sense amplifier is used with a memory cell, in accordance with some further embodiments.

FIG. 5 is a diagram of a circuit 500, in accordance with some embodiments. Circuit 500, compared with circuit 100, includes all components of circuit 100 plus signal VDDA coupled to the bulks of transistors P1 and P2. In effect, circuit 500 includes the features of both circuit 100 and circuit 400. In some embodiments, at appropriate time, either voltage VSSA is raised or voltage VDDA is lowered or both voltage VSSA is raised and voltage VDDA is lowered at the same time. One or a combination of raising voltage VSSA and lowering voltage VDDA during sensing enables circuit 500 to operate at a higher frequency.

In the above illustration, signal VSSA and VDDA are respectively raised and lowered by about one half VDD, but embodiments of the disclosure are not so limited, other values (e.g., one third VDD), are within the scope of the disclosure. In some embodiments, the raised signal VSSA and/or lowered signal VDDA are selected such that sense amplifier SENAMP runs at its highest frequency, which is achieved by simulations.

A number of embodiments have been described. It will nevertheless be understood that various modifications may be made without departing from the spirit and scope of the disclosure. For example, the various transistors being shown as a particular dopant type (e.g., NMOS and PMOS) are for illustration purposes, embodiments of the disclosure are not limited to a particular type, but the dopant type selected for a particular transistor is a design choice and is within the scope of the embodiments. The logic level (e.g., Low or High) of the various signals used in the above description is also for illustration purposes, the disclosed embodiments are not limited to a particular level when a signal is activated and/or deactivated, but, rather, selecting such a level is a matter of design choice.

For another example, in some embodiments, a circuit comprises a sensing circuit and at least one of a first node and a second node. The sensing circuit includes a pair of a first type transistors and a pair of a second type transistors. Each transistor of the pair of the first type transistors is coupled in series with a transistor of the pair of the second type transistors. The at least one of a first node has a first voltage and is coupled to each bulk of each transistor of the pair of the first type transistors. The at least one of the second node has a second voltage and is coupled to each bulk of each transistor of the pair of the second type transistors.

For another example, in some embodiments, a method comprises: setting each of a first bit line, a second bit line, a first voltage supply line, and a second voltage supply line to a first voltage level; enabling a memory cell electrically coupled to the first bit line to share charge with the first bit line; thereby causing a voltage difference between the first bit line and the second bit line to develop; changing a voltage level at bulks of a pair of transistors in a sensing pair to a first bulk level, thereby causing a change in a threshold voltage of the pair of transistors; and setting the first voltage supply line and the second voltage supply line to a first supply level and a second supply level, respectively, thereby causing the voltage difference to develop further; and changing the voltage level at the bulks of the pair of transistors to a second bulk level.

For another example, in some embodiments, a circuit comprises: a pair of data lines having a first data line and a second data line, a sensing pair, an operation voltage source, a ground voltage source, a first node, a second node, and a memory cell.

The sensing pair includes first PMOS transistor having a first PMOS source, a first PMOS drain, a first PMOS gate, and a first PMOS bulk; a second PMOS transistor having a second PMOS source, a second PMOS drain, a second PMOS gate, and a second PMOS bulk; a first NMOS transistor having a first NMOS source, a first NMOS drain, a first NMOS gate, and a first NMOS bulk; a second NMOS transistor having a second NMOS source, a second NMOS drain, a second NMOS gate, and a second NMOS bulk. The first PMOS gate is coupled to the first NMOS gate and to the first data line. The first PMOS drain is coupled to the first NMOS drain and to the second data line. The second PMOS gate is coupled to the second NMOS gate and to the second data line. The second PMOS drain is coupled to the second NMOS drain and to the first data line. The operation voltage source is coupled to the first PMOS source and the second PMOS source. The ground voltage source is coupled to the first NMOS source and the second NMOS source. The first node has a first voltage and is coupled to the first PMOS bulk and the second PMOS bulk. The second node has a second voltage and is coupled to the first NMOS bulk and the second NMOS bulk. The memory cell is coupled to a data line of the pair of data lines.

The above methods show exemplary steps, but they are not necessarily performed in the order shown. Steps may be added, replaced, changed order, and/or eliminated as appropriate, in accordance with the spirit and scope of the disclosed embodiments.

What is claimed is:

1. A circuit comprising:
   a sensing circuit including
      a pair of a first type transistors;
      a pair of a second type transistors; each transistor of the pair of the first type transistors coupled in series with a transistor of the pair of the second type transistors; and
   at least one of
      a first node having a first voltage and coupled to each bulk of each transistor of the pair of the first type transistors, wherein the first voltage is lowered when the sensing circuit is on and the first type transistors are P-type transistors; or
      a second node having a second voltage and coupled to each bulk of each transistor of the pair of the second type transistors, wherein the second voltage is raised when the sensing circuit is on and the second type transistors are N-type transistors.

2. The circuit of claim 1 further comprising a memory cell coupled to a data line of a pair of data lines wherein the memory cell and the data line share a same charge when the memory cell is accessed.

3. The circuit of claim 1, wherein the first voltage is lowered and the second voltage is raised by about a same amount.

4. The circuit of claim 1, wherein a sense amplifier using the sensing circuit is configured to run at a frequency when the first voltage is lowered or the second voltage is raised, and the frequency is higher than that of a configuration when the first voltage and the second voltage remain if the sensing circuit is on.

5. The circuit of claim 1, wherein:
   the first node is configured as an operation supply voltage source of the circuit; and
   when the sensing circuit is on, the second voltage is set at a level higher than a ground reference level of the circuit.

6. The circuit of claim 1, wherein:
   the first node is configured as a ground node of the circuit; and
   when the sensing circuit is on, the second voltage is set at a level lower than an operation voltage level of the circuit.

7. The circuit of claim 1, wherein, when the sensing circuit is on, at least a threshold voltage of the pair of the first type transistor or a threshold voltage of the pair of the second type transistor changes.

8. A method comprising:
   setting each of a first bit line, a second bit line, a first voltage supply line, and a second voltage supply line to a first voltage level;
   enabling a memory cell electrically coupled to the first bit line to share charge with the first bit line; thereby causing a voltage difference between the first bit line and the second bit line to develop;
   changing a voltage level at bulks of a pair of transistors in a sensing pair to a first bulk level, thereby causing a change in a threshold voltage of the pair of transistors, wherein the changing the voltage level comprises raising the voltage level at the bulks if the pair of transistors are N-type transistors and lowering the voltage level at the bulks if the pair of transistor are P-type transistors;
   setting the first voltage supply line and the second voltage supply line to a first supply level and a second supply level, respectively; thereby causing the voltage difference to develop further; and
   changing the voltage level at the bulks of the pair of transistors to a second bulk level.

9. The method of claim 8, wherein:
   bulks of a second pair of transistors in the sensing pair are electrically coupled to a source of supply voltage having the first supply level; and
   the first bulk level is higher than the second supply level and lower than the first supply level.

10. The method of claim 9, wherein the pair of transistors are NMOS transistors and the second pair of transistors are PMOS transistors.

11. The method of claim 8, wherein:
   bulks of a second pair of transistors in the sensing pair are electrically coupled to a ground node; and
   the first bulk level is lower than the first supply level and higher than the second supply level.

12. The method of claim 11, wherein the second pair of transistors are NMOS transistors and the pair of transistors are PMOS transistors.

13. The method of claim 8 further comprising:
   changing a voltage level at bulks of a second pair of transistors in the sensing pair to a third bulk level, thereby causing a change in a threshold voltage of the second pair of transistors; and
   changing the voltage level at the bulks of the second pair of transistors to a fourth bulk level.

14. The method of claim 8, wherein at least one of the following conditions is met:
   changing the voltage level at the bulks of the pair of transistors in the sensing pair to the first bulk level is done at about a time when the voltage difference develops to a first pre-determined value; and
   changing the voltage level at the bulks of the pair of transistors to the second bulk level is done at about a time when the voltage difference develops to a second pre-determined value.

15. The method of claim 8, wherein changing the voltage level to the first bulk level comprises changing the voltage level by a magnitude ranging from one-third to one-half of a difference between the first supply voltage and the second supply voltage.

16. A circuit comprising:
a pair of data lines having a first data line and a second data line;
a sensing pair including
- a first PMOS transistor having a first PMOS source, a first PMOS drain, a first PMOS gate, and a first PMOS bulk;
- a second PMOS transistor having a second PMOS source, a second PMOS drain, a second PMOS gate, and a second PMOS bulk;
- a first NMOS transistor having a first NMOS source, a first NMOS drain, a first NMOS gate, and a first NMOS bulk; and
- a second NMOS transistor having a second NMOS source, a second NMOS drain, a second NMOS gate, and a second NMOS bulk; the first PMOS gate coupled to the first NMOS gate and to the first data line; the first PMOS drain coupled to the first NMOS drain and to the second data line; the second PMOS gate coupled to the second NMOS gate and to the second data line; the second PMOS drain coupled to the second NMOS drain and to the first data line;

an operation voltage source coupled to the first PMOS source and the second PMOS source;
a ground voltage source coupled to the first NMOS source and the second NMOS source;
a first node having a first voltage and coupled to the first PMOS bulk and the second PMOS bulk;
a second node having a second voltage and coupled to the first NMOS bulk and the second NMOS bulk, wherein when the sensing pair is turned on, the first voltage is lowered or the second voltage is raised; and
a memory cell coupled to a data line of the pair of data lines.

17. The circuit of claim 16, wherein when the sensing pair is turned on, both the first voltage is lowered and the second voltage is raised.

18. The circuit of claim 17, wherein the first voltage is lowered and the second voltage is raised by about a same amount.

19. The circuit of claim 16, wherein the sensing pair is turned on when a voltage of the operation voltage source transitions from a reference voltage to an operation voltage and a voltage of the ground voltage source transitions from the reference voltage to a ground voltage; the reference voltage is about half of the operation voltage minus the ground voltage.

20. The circuit of claim 16, wherein, when the sensing circuit is on, the sensing circuit is configured to temporarily change at least a threshold voltage of the first and the second PMOS transistors or a threshold voltage of the first and the second NMOS transistors.

* * * * *